(12) United States Patent
Dasgupta et al.

(10) Patent No.: US 8,496,999 B2
(45) Date of Patent: Jul. 30, 2013

(54) FIELD-AIDED PREFERENTIAL DEPOSITION OF PRECURSORS

(75) Inventors: Neil Dasgupta, Menlo Park, CA (US); Friedrich B. Prinz, Woodside, CA (US); Timothy P. Holme, Menlo Park, CA (US); Stephen Walch, Fremont, CA (US); Wonyoung Lee, Stanford, CA (US); James F. Mack, Palo Alto, CA (US)

(73) Assignees: The Board of Trustees of the Leland Stanford Junior University, Palo Alto, CA (US); Honda Motor Co., Ltd, Tokyo (JP)

( * ) Notice: Subject to any disclaimer, the term of this patent is extended or adjusted under 35 U.S.C. 154(b) by 1082 days.

(21) Appl. No.: 12/383,588

(22) Filed: Mar. 24, 2009

(65) Prior Publication Data

US 2009/0258157 A1 Oct. 15, 2009

Related U.S. Application Data

(60) Provisional application No. 61/070,689, filed on Mar. 24, 2008.

(51) Int. Cl.
*C23C 16/02* (2006.01)
(52) U.S. Cl.
USPC .......................................... 427/532; 117/88
(58) Field of Classification Search
USPC ..................................... 427/532; 117/84, 88
See application file for complete search history.

(56) References Cited

U.S. PATENT DOCUMENTS

| | | | |
|---|---|---|---|
| 5,116,782 A | 5/1992 | Yamaguchi et al. | |
| 5,126,574 A | 6/1992 | Gallagher | |
| 7,323,387 B2 | 1/2008 | Yi | |
| 7,326,293 B2 | 2/2008 | Randall | |
| 8,197,701 B2 * | 6/2012 | Carlisle et al. | 216/11 |
| 8,261,368 B2 * | 9/2012 | Bussan et al. | 850/1 |
| 2005/0207064 A1 * | 9/2005 | Costrini et al. | 360/231 |
| 2005/0223968 A1 * | 10/2005 | Randall et al. | 117/94 |
| 2006/0177601 A1 * | 8/2006 | Park et al. | 427/576 |
| 2006/0269688 A1 | 11/2006 | Sadewasser | |
| 2007/0164214 A1 * | 7/2007 | Choi et al. | 250/306 |
| 2007/0277735 A1 * | 12/2007 | Mokhlesi et al. | 118/723 R |
| 2009/0238990 A1 * | 9/2009 | Dasgupta et al. | 427/540 |
| 2009/0258157 A1 * | 10/2009 | Dasgupta et al. | 427/532 |
| 2012/0207944 A1 * | 8/2012 | Finch et al. | 427/526 |

FOREIGN PATENT DOCUMENTS

EP 1682445 5/2005

OTHER PUBLICATIONS

Laracuente, Arnaldo, et al., "Chemical vapor deposition of nanometer-size aluminum features on silicon surfaces using an STM tip". Applied Surface Science 107 (1996) 11-17.*
Lee, Wonyoung, et al., "Area-Selective Atomic Layer Deposition Using Self-Assembled Monolayer and Scanning Probe Lithography". Journal of the Electrochemical Society, 156 (9) G125-G128 (2009).*
Hua, Yueming, et al., "Nanopatterning materials using area selective atomic layer deposition in conjunction with thermochemical surface modification via heated AFM cantilever probe lithography". Microelectronic Engineering 85 (2008) 934-936.*
Mack, James F., et al., "A combined scanning tunneling microscope-atomic layer deposition tool". Review of Scientific Instruments 82, 123704 (2011), pp. 1-8).*
Lee, Jae P., et al., "A New Patterning Method Using Photocatalytic Lithography and Selective Atomc Layer Deposition". J. Am. Chem. Soc. 2004, vol. 126, No. 1, 28-29.*
Groner, M.D., et al., "Low-Temperature Al2O3 Atomic Layer Deposition". Chem. Mater. 2004, vol. 16, No. 4, 639-645.*
Suda, Masayuki, et al., "Electrochemical and Optical Processing of Micro Structures by Scanning Probe Microscopy (SPM)". 1996 IEEE, pp. 296-300.*
Laracuente et al., "Chemical Vapor deposition of nanometer-siza aluminum features on silicon surfaces using an STM tip", 1996, Applied Surface Science v107, pp. 11-17.
Bruckl et al., "Low energy electron beam decomposition of metalorganic precursors with a scanning tunneling microscope at ambient atmosphere", 1999, J. Vac. Sci. Tech. B17(4), pp. 1350-1353.
Kang et al., "The effect of an electric field on the chemical vapor deposition of (100) diamond", 2001, Nanotechnology v12, pp. 258-264.
Shen et al., "Atomic-scale Desorption through Electronic and Vibrational Excitation Mechanisms", 1995, Science (new series) v268n5217, pp. 1590-1592.
Avouris et al., "Breaking individual chemical bonds via STM-induced excitations", 1996, Surface Science v363, pp. 368-377.
Gouzman et al., "DC-glow discharge as a key step for the bias-enhanced nucleation of diamond by the HF CVD method", 1998, Diamond and Related Materials v7, pp. 209-214.
Yugo et al., "Effects of electric field on the growth of diamond by microwave plasma CVD", 1990, Vacuum v41, pp. 1364-1367.

* cited by examiner

*Primary Examiner* — Bret Chen
(74) *Attorney, Agent, or Firm* — Lumen Patent Firm

(57) ABSTRACT

Area selective atomic layer deposition is provided by a method including the following steps. First, a substrate is provided. Second, a tip of a scanning probe microscope (SPM) is disposed in proximity to the surface of the substrate. An electrical potential is then established between the tip and the surface that cause one or more localized electrical effects in proximity to the tip. Deposition reactants for atomic layer deposition (ALD) are provided, and deposition occurs in a pattern defined by the localized electrical effects because of locally enhanced ALD reaction rates.

10 Claims, 4 Drawing Sheets

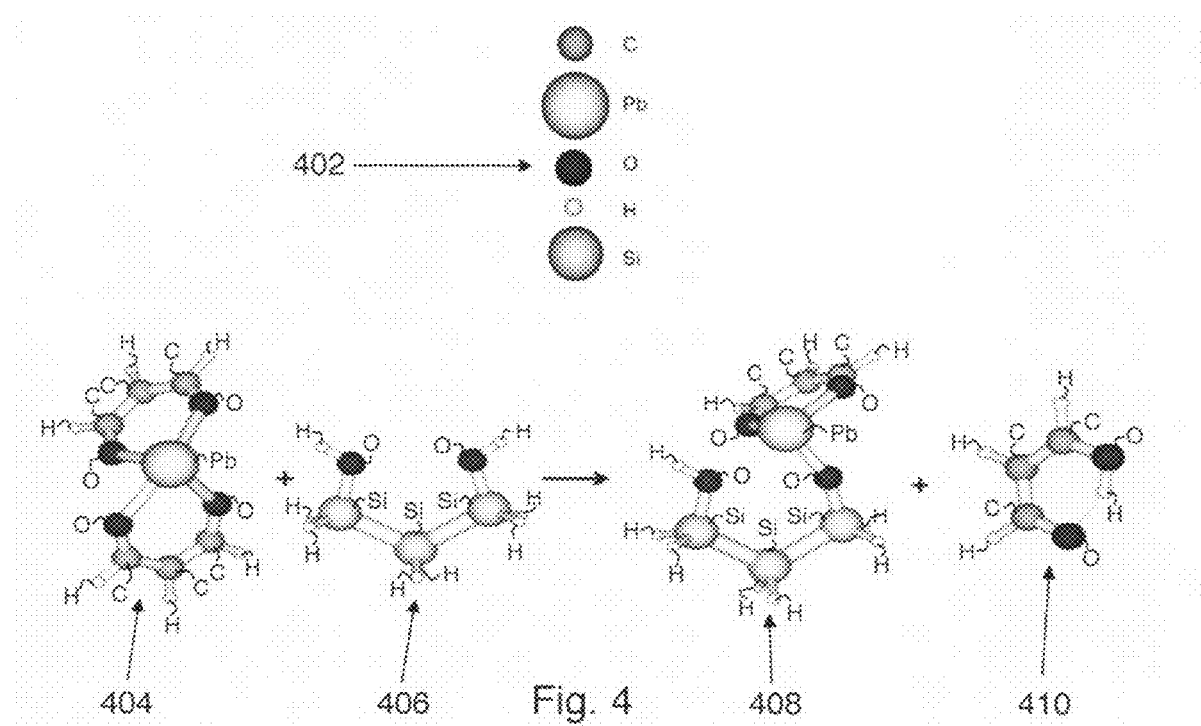
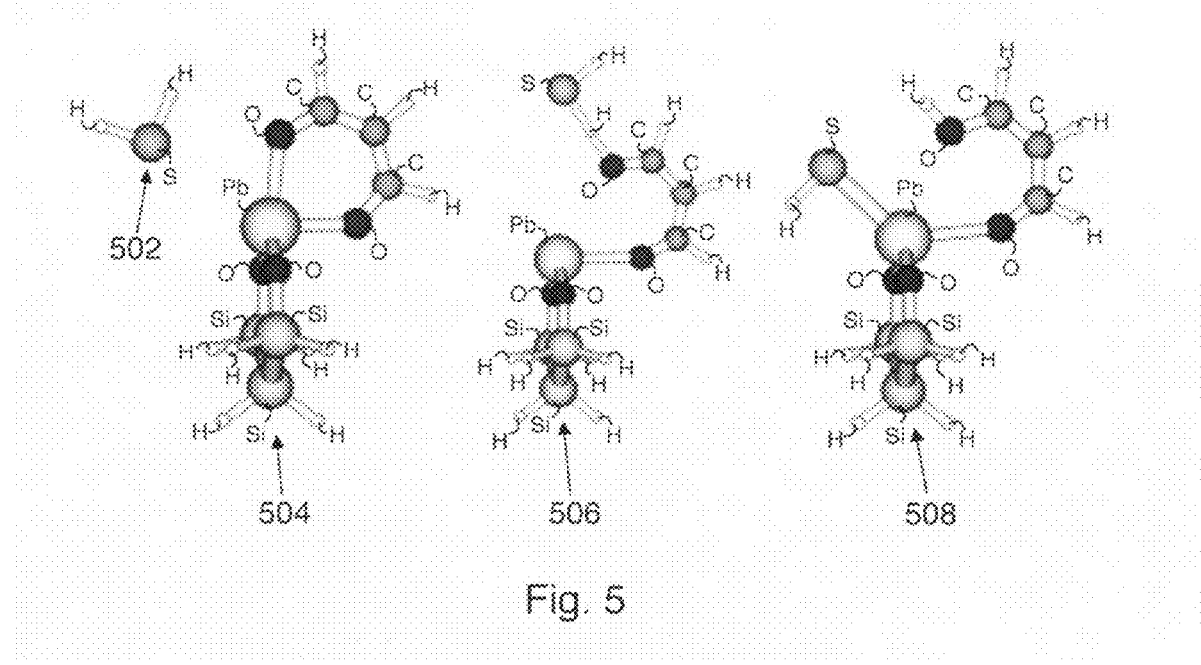
Fig. 5

FIELD-AIDED PREFERENTIAL DEPOSITION OF PRECURSORS

CROSS REFERENCE TO RELATED APPLICATIONS

This application claims the benefit of U.S. provisional patent application 61/070,689, filed on Mar. 24, 2008, entitled "Field-Aided Preferential Deposition of Precursors", and hereby incorporated by reference in its entirety.

FIELD OF THE INVENTION

This invention relates to lateral pattern control for atomic layer deposition.

BACKGROUND

Atomic layer deposition is a thin film growth technique that employs a sequence of self-limiting surface reaction steps to allow sub-nanometer control of the growth process. The self-limiting adsorption reactions ensure precise control of film thickness and uniformity over large areas. For example, with ALD it is possible to ensure that growth of layer #1 is complete before growth of layer #2 on top of layer #1 is initiated. In this manner, ALD provides very accurate and precise control of device structure and composition in the growth direction (typically taken to be the z direction). However, it remains challenging to provide a comparable level of structure/composition control for ALD in the lateral directions (i.e., x and y directions).

Various methods have been investigated for providing lateral patterning capability in combination with ALD. It is important that such patterning techniques not disrupt the layer by layer growth that is characteristic of ALD, and substantial simulation and/or experimental investigation is typically required to confirm the suitability of any particular patterning methods for use with ALD. For example, one approach that has been experimentally investigated is the use of microcontact printed resists.

Another approach which has been considered for lateral patterning combined with ALD is the use of a scanning probe microscopy (SPM) tip to add or remove passivating material from a substrate surface (U.S. Pat. No. 7,326,293). The resulting pattern of passivation material controls the lateral pattern of subsequent ALD. However, this process of directly adding or removing passivation material from the surface of a substrate can be time-consuming and/or can cause difficulties in practice (e.g., when removing passivation material from a surface, the removed material may accumulate on the tip and degrade performance).

Accordingly, it would be an advance in the art to provide a tip-patterned ALD method that does not suffer from the above-identified problems.

SUMMARY

Lateral nano-scale pattern control for atomic layer deposition can be provided by using a scanning tunneling microscope (SPM) tip to locally influence chemical reaction rates. An electric field and/or charge transfer can significantly reduce the potential energy barrier that affects reaction kinetics, and thereby significantly enhance reaction rates. By operating the ALD growth system in a regime where reaction rates without an electric field and/or charge transfer are negligible, deposition can be precisely controlled to occur only at locations defined by the SPM tip.

In an embodiment, a method for performing area-selective atomic layer deposition is provided. The method includes: providing a substrate, disposing a tip of a scanning probe microscope in proximity to a surface of the substrate, and establishing an electrical potential difference between the tip and the surface of the substrate, which causes one or more localized electrical effects to occur in proximity to the tip. Deposition reactants are provided to the substrate such that self-limited reactions provide atomic layer by atomic layer growth, and deposition on said substrate occurs in a deposition pattern defined by the localized electrical effects. For example, deposition can occur at locations where deposition reactions are enhanced by the localized electric effects, and not at other locations. As an alternative, the localized electric effects could act to inhibit ALD reactions, which could be used to provide ALD growth at all locations except those in proximity to an SPM tip.

Although any kind of scanning probe microscope having a tip capable of causing localized electrical effects can be employed, scanning tunneling microscopes (STMs) and atomic force microscopes (AFMs) are preferred. In an STM, a tunneling current flows between the tip and the substrate, while in an AFM, mechanical forces arise between the tip and sample surface.

It is preferred that the localized electrical effects have sufficient strength to define the deposition pattern, but are sufficiently weak that the reactions remain self-limited. With reference to FIG. 2, the localized electrical effects should control whether deposition occurs in ALD window 204 or in kinetically limited regime 206, and it is important to ensure that the localized electrical effects cannot lead to growth in regime 202.

The localized electrical effects can include one or more of: DC electric field, AC electric field, DC current flow, AC current flow, DC electronic charge transfer, and AC electronic charge transfer. Simulations as described in more detail below have indicated that a DC electric field can enhance ALD reaction rates.

In some cases, the tip is held fixed relative to the substrate during deposition (e.g., to define a quantum dot). In other cases, the tip can be moved with respect to the substrate during deposition (e.g., to define multiple dots or features with a single tip). Tip scanning can be a relatively rapid process, compared to ALD reactant purging, so scanning a tip to provide multiple features does not necessarily greatly increase growth time. However, scanning the tip during deposition requires accurate techniques for registering the pattern of one ALD layer with the patterns on other ALD layers. A microscope having several tips (e.g., arranged in a regular array) can also be used. This approach can avoid difficulties associated with scanning a single tip to define an array of dots.

BRIEF DESCRIPTION OF THE DRAWINGS

FIG. 4 shows chemical structures of a simulated atomic layer deposition half-reaction.

FIG. 5 shows chemical structures of another simulated atomic layer deposition half-reaction.

DETAILED DESCRIPTION

To better appreciate the present invention, it is helpful to briefly review some features of atomic layer deposition. FIGS. 1a-d show steps in a typical ALD fabrication sequence.

Figures 1A, 1B:
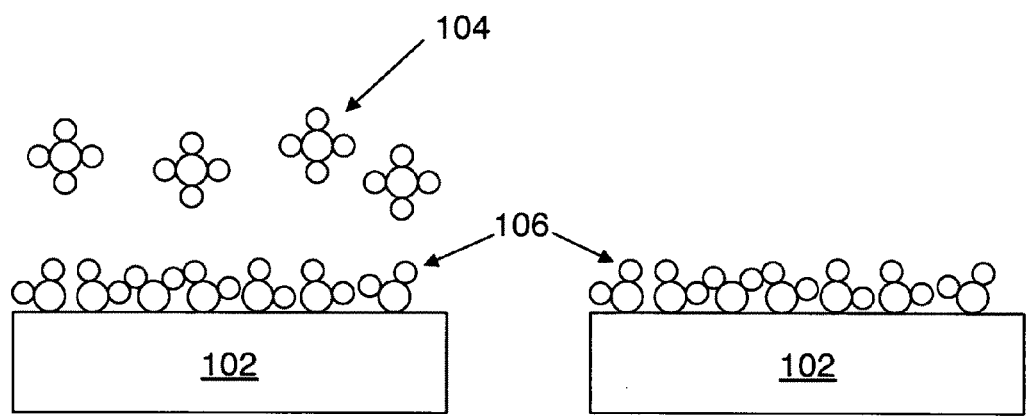
FIGS. 1a-d show typical steps in an atomic layer deposition process.
Figures 1C, 1D:
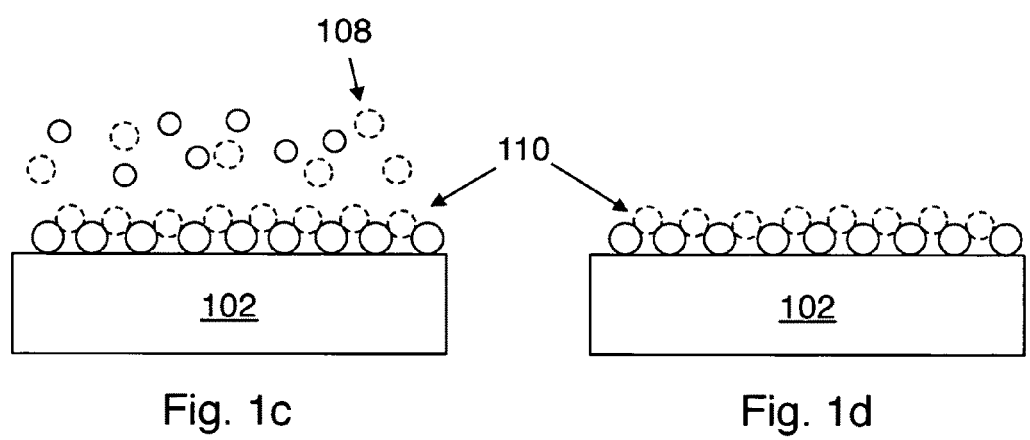

Atomic layer deposition is a leading technology for conformal growth of ultra-thin films with sub-nanometer precision. ALD can be regarded as a modified version of metalorganic chemical vapor deposition (MOCVD) in which the reaction is separated into self-limiting half reactions of precursors in order to gain precise control of film uniformity and thickness. Precursor molecules are typically volatile metal complexes coordinated by organic ligands, which prevent the formation of more than a single monolayer per cycle. In the first step (FIG. 1a), gas-phase precursor molecules 104 are introduced into the reaction chamber at relatively low temperatures (300-700K), and adsorb onto the surface of the substrate 102 as layer 106. The excess precursor is purged from the chamber (FIG. 1b). Next, an oxidant 108 is introduced into the chamber (FIG. 1c), which oxidizes the metal and removes the ligands from layer 106, forming material 110 on substrate 102. The excess oxidant is purged from the chamber (FIG. 1d). By repeating this process in a step-by-step manner, film thickness and stoichiometry can be controlled with high precision.

ALD differs from chemical vapor deposition in several significant aspects. In chemical vapor deposition (CVD), a continuous flow of reactants is typically provided, and the thickness of deposited material is controlled by calibrating the growth rate and then using the known growth rate to determine the time needed to grow a desired thickness. In contrast, ALD proceeds layer by layer, and the thickness of deposited material is determined by the number of layers grown (thickness per layer is often known, or it can be measured). An ALD system differs from a CVD system mainly by the addition of more complicated reactant flow valves and controllers, to accommodate the purge cycles characteristic of ALD. In the present approach, an ALD growth chamber can be modified to establish a controllable electric potential difference between the SPM tip and the substrate.

While ALD provides perhaps the best available control of material thickness in the Z-direction, to fabricate precise arrays of quantum dots, material growth in the plane of the substrate must be controlled with nanometer precision. Localized electric fields from conductive SPM tips can precisely define the lateral position of the deposited material. This lateral patterning technique should be applicable to a wide variety of materials, including metals, semiconductors and insulators. ALD of Platinum (Pt), Lead Sulfide (PbS), and $ZrO_2$ have all been demonstrated, and it is expected that this lateral patterning approach is applicable to at least these material systems. These are materials of great interest for next-generation energy conversion devices, including fuel cells, solar cells, batteries and more.

Important characteristics of an ALD precursor include a low sublimation temperature, thermal stability against decomposition in the gas phase, and good reactivity with the desired oxidant. Metal precursors are typically metalorganic compounds, in which the positive cation is surrounded by negatively charged ligands. A great amount of research is currently underway to develop new precursors suitable for ALD. In order to facilitate the growth of a many different materials, it is helpful to understand the underlying chemistry on the atomic level. Accordingly, we have developed techniques to evaluate precursors for reactivity and stability using quantum simulations that enable us to rapidly screen candidate precursors.

Figure 2:
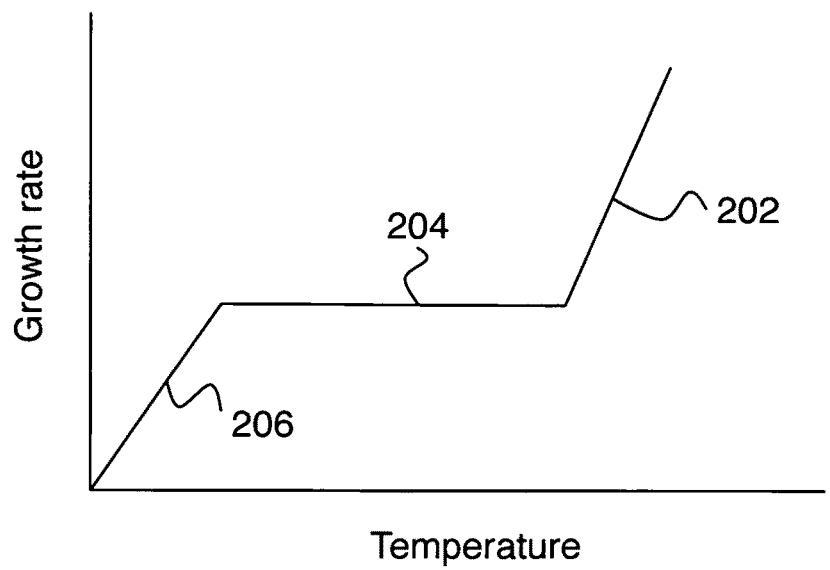
FIG. 2 is a schematic reaction rate vs. temperature plot.

ALD reactions are often characterized by studying the film growth rate (film thickness per cycle) as a function of temperature. A typical growth curve for an ALD reaction is illustrated in FIG. 2.

The self-limiting growth regime of ALD, which allows digital control of thickness with the number of cycles, is identified by the presence of an "ALD window" 204, in which the growth rate is constant over a range of temperatures. At temperatures above the ALD window (section 202 of the growth curve), the growth rate increases with temperature, often due to decomposition of the precursor. This is the regime of traditional metalorganic chemical vapor deposition (MOCVD). At temperatures below the ALD window (section 206 of the growth curve), the chemical reaction is kinetically limited due to insufficient thermal energy to overcome the activation barrier between the product and reactant species.

Figure 3:
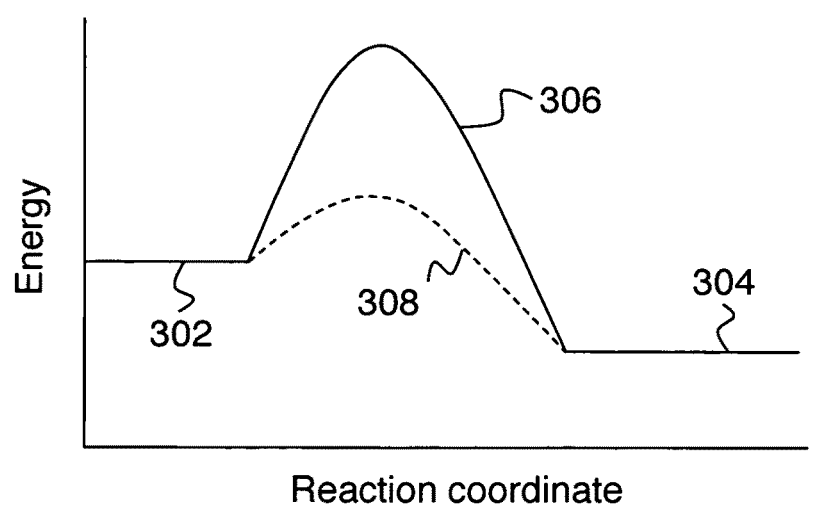
FIG. 3 is an energy vs. reaction coordinate diagram.

An ALD reaction, like any chemical reaction, involves a transition between two minima in the potential energy of the system, namely the products and reactants. While the thermodynamics of the reaction are dictated by the difference in free energy between these two states, the kinetics of the reaction are determined by the energy required to pass through an intermediate transition state. The energetics of a typical ALD reaction are illustrated in FIG. 3. In this example, the energy level of the reactants is shown as 302, and the energy level of the products is shown as 304. An energy barrier 306 (or 308) must be overcome for the reaction to proceed from reactants to products. According to the above-described principles, application of a localized electric field and/or localized charge transfer with an SPM tip can alter the height of the energy barrier (e.g., reduce barrier 306 to barrier 308 on FIG. 3), thereby locally enhancing the rate of ALD reactions.

The simulations described below indicate that localized electric fields and/or localized charge transfer on a substrate can lower the activation barrier for the ALD reaction. Therefore, by choosing environmental conditions such that the kinetics of the ALD reaction will be severely limited, and locally modifying the substrate using electric fields and charges supplied by a conductive AFM tip, we can lower the activation barrier for the ALD reaction in specific locations. This will allow film growth to be patterned with nanometer precision in the plane of the substrate, while maintaining the excellent thickness control of ALD.

To test the hypothesis that local fields and charge transfer from a tip may influence the kinetics and energetics of ALD reactions, density functional theory was used to perform quantum simulations of the reaction process of PbS deposition with $Pb(tmhd)_2$ ($tmhd=C_3HO_2(Bu^t)_2$) as the precursor and $H_2S$ as the reactant. We have modeled the first two steps in generation of a PbS overlayer by ALD on an OH terminated silica surface. We have chosen to model the tmhd precursor as $C_3H_3O_2$, referred to as lig, which should react in substantially the same manner as the full precursor, and the substrate was modeled as a $Si_3$ cluster terminated in the bulk by H atoms and OH groups on the surface.

The first step is shown in FIG. 4, where 402 shows a legend for chemical elements. Here a $Pb(lig)_2$ precursor 404 adds to the surface 406 to generate a $Pb(lig)_1$ species 408, chemically bound to one surface O atom and hydrogen bonded to an adjacent OH, and a ligH species 410. This process is computed to be endothermic by ~0.2 eV. Adsorption energy varies with precursor chemistry, allowing use of materials that will be stable at high temperatures.

Next we have considered the second ALD half-reaction, whereby $H_2S$ 502 attacks the Pb-lig bond in reactant 504 to form product Pb—S—H 508 and remove the lig-H. This reaction is shown on FIG. 5. The configuration at the saddle point of the reaction is shown as 506. Reactant 504 on FIG. 5 has a slightly different configuration than product 408 on FIG. 4. It is assumed that this difference does not significantly affect the results. From FIG. 5 it is seen that in the product 508 an H atom has been transferred to one O atom of the ligand and an SH group is bound to the Pb atom. The hydrogenated ligand has larger metal to ligand distances, which is expected since it is isoelectronic with the −1 charged ligand. Without an applied electric field we calculate a barrier of 0.8 eV for this process; however, the application of an electric field perpendicular to the surface is found to reduce this barrier to zero. For these simulations, a field strength of 0.01 atomic units or ~0.5 V/Angstrom was applied normal to the surface. This is an appropriate field strength for an STM or conductive AFM tip applying 1-10 V at a distance of less than 2 nm from the surface. Thus, we expect that application of a localized electric field can greatly enhance the rate of $H_2S$ addition.

By choosing chemical and thermal conditions such that the ALD reaction is thermodynamically and/or kinetically limited (such as low temperatures and reactions with high activation barriers) we can prevent ALD growth in all areas of the substrate except the area activated by the tip. Also, by varying the precursor chemistry we can grow a variety of materials. By combining the vertical control of ALD with the lateral control of AFM we can achieve 3-D control of quantum dot size, shape and stoichiometry.

Figure 6:
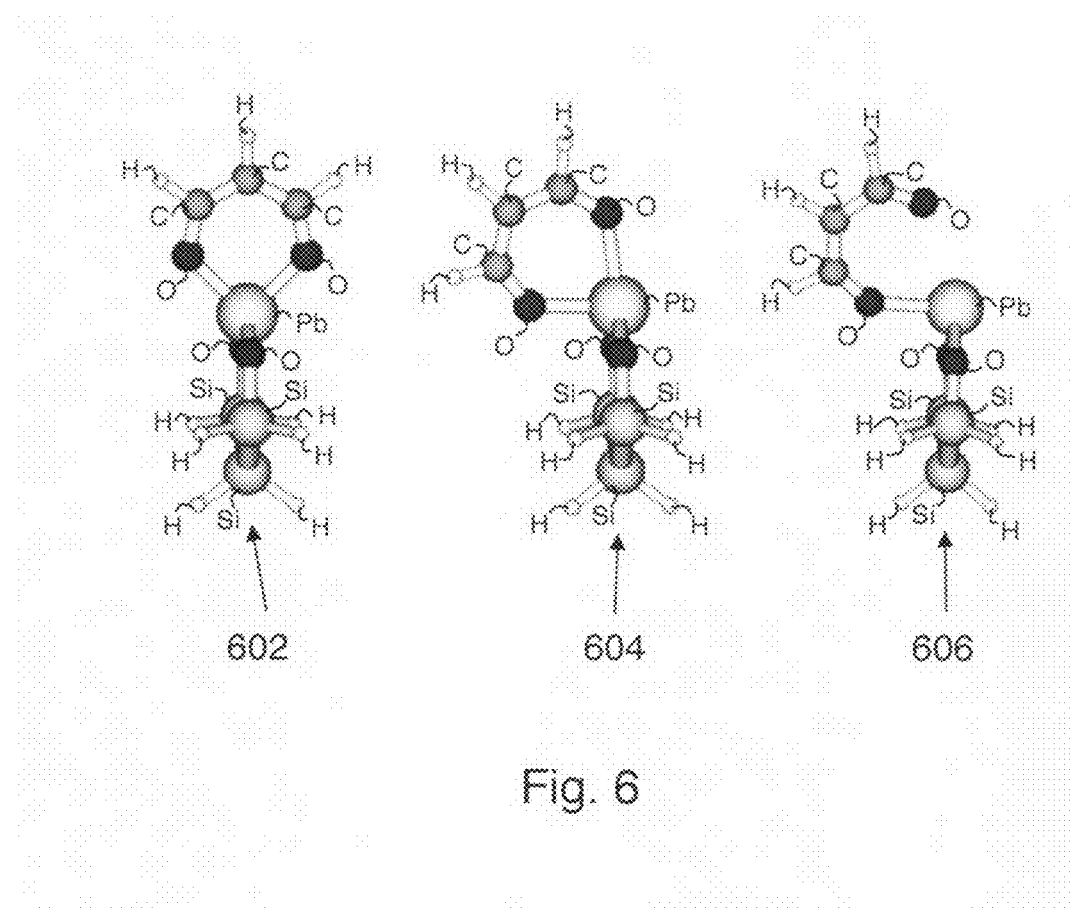
FIG. 6 shows simulated surface configurations for several different charge states.

We also performed quantum simulations on the Si—Pb-tmhd system to consider the effect of change in oxidation state on the metal-ligand binding energy as shown in FIG. 6. Here 604 is a neutral configuration, 602 shows a +1e configuration, and 606 shows a −1e configuration. Here it is seen that the ligand to metal distance decreases upon oxidation and increases upon reduction. This implies that reduction may weaken the metal-ligand bond and lead to more favorable kinetics for removing a ligand. Note that we find the ligH species is isoelectronic with the reduced species leading to a propensity to dissociate from Pb as discussed above.

For the reduced (negatively charged) surface species 606 we find that the extra electron is located mainly on the ligand, so that the ligand has a negative charge and the Pb atom has a positive charge. Applying an electric field perpendicular to the surface, with the correct orientation to separate the ligand and Pb atom, results in weakening or dissociating the Pb to ligand bond. Thus, the process of reducing the surface followed by applying an electric field should facilitate the removal of the ligand.

The invention claimed is:

1. A method for performing area-selective atomic layer deposition, the method comprising:
   providing a substrate;
   disposing a tip of a scanning probe microscope in proximity to a surface of said substrate;
   establishing an electrical potential difference between said tip and said surface, which causes one or more localized electrical effects to occur in proximity to said tip;
   providing two or more deposition reactants to said substrate such that self-limited chemical reactions provide atomic layer by atomic layer growth;
   wherein said chemical reactions have locally enhanced reaction rates due to said localized electrical effects;
   whereby deposition of said reactants on said substrate occurs in a deposition pattern defined by said localized electrical effects.

2. The method of claim 1, wherein said scanning probe microscope is an atomic force microscope.

3. The method of claim 1, wherein said scanning probe microscope is a scanning tunneling microscope.

4. The method of claim 1, wherein said localized electrical effects have sufficient strength to define said deposition pattern, but are sufficiently weak that said reactions remain self-limited.

5. The method of claim 1, wherein said localized electrical effects comprise one or more effects selected from the group consisting of: DC electric field, AC electric field, DC current flow, AC current flow, DC electronic charge transfer, and AC electronic charge transfer.

6. The method of claim 1, wherein said localized electric effects comprise a DC electric field, and wherein chemical reaction rates of said self-limited reactions are enhanced by said DC electric field.

7. The method of claim 1, wherein a tunneling current flows between said tip and said substrate.

8. The method of claim 1, further comprising moving said tip relative to said substrate during deposition.

9. The method of claim 1, further comprising holding said tip fixed relative to said substrate during deposition.

10. The method of claim 1, further comprising providing one or more additional scanning probe microscope tips, each of which controls where deposition occurs according to the method of claim 1.

* * * * *